United States Patent [19]

Brauer

[11] Patent Number: 5,373,104
[45] Date of Patent: Dec. 13, 1994

[54] CONTROL MODULE WITH INTEGRAL FASTENING/LOCKING ASSEMBLY

[75] Inventor: Eric A. Brauer, Indianapolis, Ind.

[73] Assignee: Delco Electronics Corporation, Kokomo, Ind.

[21] Appl. No.: 89,107

[22] Filed: Jul. 12, 1993

[51] Int. Cl.⁵ .................... H02G 3/08; H05K 5/00; H05K 1/14

[52] U.S. Cl. .................... 174/52.1; 361/758; 361/759; 361/736; 361/742; 206/508

[58] Field of Search .............. 361/796, 742, 747, 758, 361/759, 784, 752, 818; 206/509, 508; 174/52.1, 52.4

[56] References Cited

U.S. PATENT DOCUMENTS

| | | | |
|---|---|---|---|
| 4,041,548 | 8/1977 | Salisbury | 361/396 |
| 4,226,491 | 10/1980 | Kazama | 339/17 LM |
| 4,295,181 | 10/1981 | Chang | 361/395 |
| 4,388,672 | 6/1983 | Skill | 361/412 |
| 4,394,545 | 7/1983 | Doyle | 179/179 |
| 4,680,676 | 7/1987 | Petratos | 361/424 |
| 4,912,602 | 3/1990 | Zurek | 361/399 |
| 5,045,971 | 9/1991 | Ono | 361/386 |
| 5,107,404 | 4/1992 | Tam | 361/424 |
| 5,206,796 | 4/1993 | Thompson | 361/424 |
| 5,258,889 | 11/1993 | Belanger | 361/740 |

FOREIGN PATENT DOCUMENTS

| | | | |
|---|---|---|---|
| 1239410 | 7/1960 | France | 206/509 |
| 1321697 | 12/1989 | Japan | 361/796 |

Primary Examiner—Leo P. Picard
Assistant Examiner—Stephen T. Ryan
Attorney, Agent, or Firm—Mark A. Navarre

[57] ABSTRACT

A control module having an integral fastening and locking case assembly whereby a support spacer frame for circuit boards and case members are assembled to create a single unit without the use of conventional fasteners. The structure of the housing and the support spacer frame provides an arrangement whereby the sectional equipment may securely snapped together to form a single unit without the use of conventional fasteners.

5 Claims, 6 Drawing Sheets

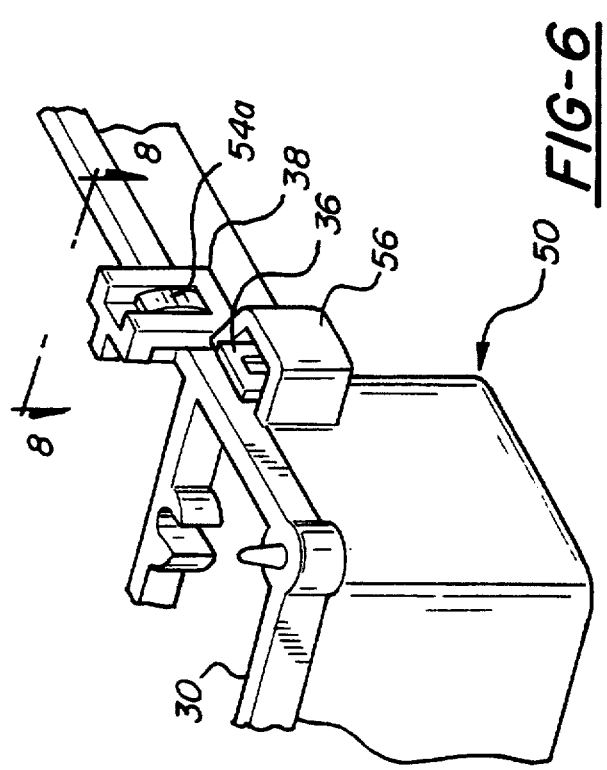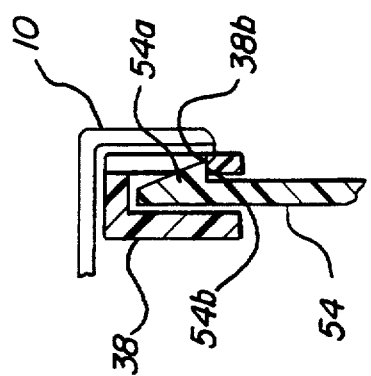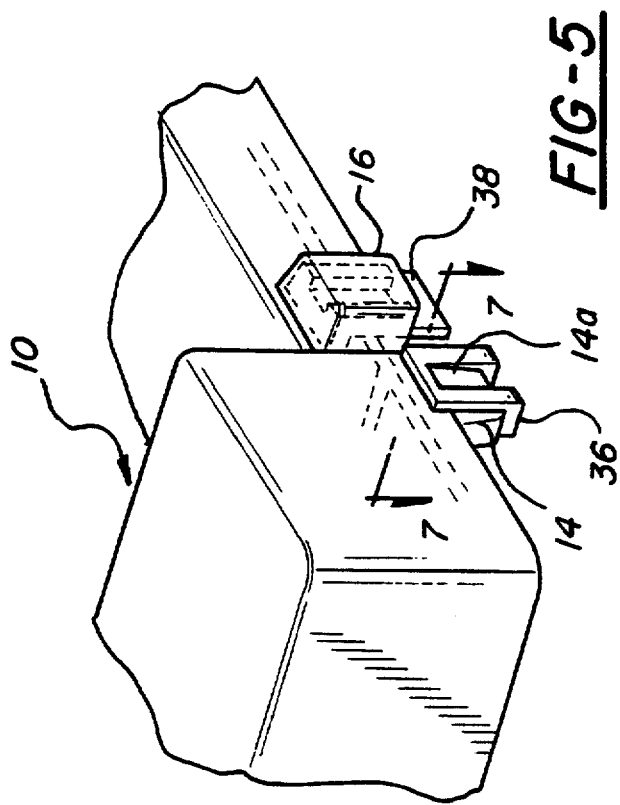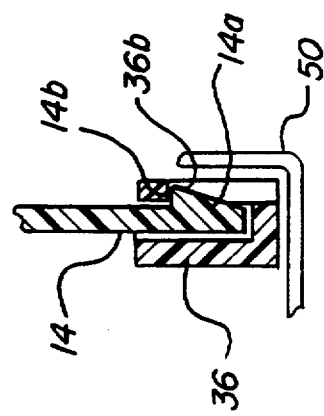

CONTROL MODULE WITH INTEGRAL FASTENING/LOCKING ASSEMBLY

BACKGROUND OF THE INVENTION a) Field of the Invention

This invention relates generally to a device for securing together portions of a housing and more particularly to a device providing an integral fastening and locking assembly whereby a support spacer frame for circuit boards and case members are assembled to create a single unit without the use of conventional fasteners. The structure of the housing portions and the support spacer frame provides an arrangement whereby the components or sectional equipment may be securely snapped together to form a single unit.

b) Description of Related Art

Currently, the assembly of electrical control modules requires a plurality of mounting fixtures, such as rivets, screws, or other hardware, to secure internal parts and the outer covers together. Screws are very good fasteners but are a source of many problems during assembly because driving screws correctly presents a continuous problem and source for errors in assembly.

There exists a need, therefore, to provide a mechanical interlocking system which provides an effective means by which the housing portions and components contained therein can be secured with respect to one another.

SUMMARY OF THE INVENTION

The present invention teaches a housing assembly which eliminates the need for additional fasteners by providing a frame which supports at least one circuit board within the assembly. Integral with the frame are features which snap over and lock with individual case members cooperating with the snapping features of the frame. In this manner, the electrical control module is secured tightly without the use of screws or additional part fastening devices. The elimination of the additional conventional fasteners also serves to reduce assembly time.

The present invention incorporates an inner support structure or spacer to hold the case halves and the circuit board together by using features of the support which snap and integrally lock the assembly as a unit using minimum parts.

Other features and advantages of the present invention will become apparent from the following description of the preferred embodiment, taken in conjunction with accompanying drawings, which illustrate, by way of example, the principles of the invention.

BRIEF DESCRIPTION OF THE DRAWINGS

FIG. 5 is a partial cross section of the snap assembly of the first embodiment of FIG. 1.

FIG. 6 is a partial cross section of the snap assembly of the first embodiment of FIG. 1.

FIG. 7 is a partial cross sectional view of the snap lock arrangement of the embodiment of FIG. 5 taken along line VII—VII FIG. 8 is a partial cross sectional view of the snap lock arrangement of the embodiment of FIG. 6 taken along line VIII—VIII.

DESCRIPTION OF THE PREFERRED EMBODIMENTS

Figure 1:
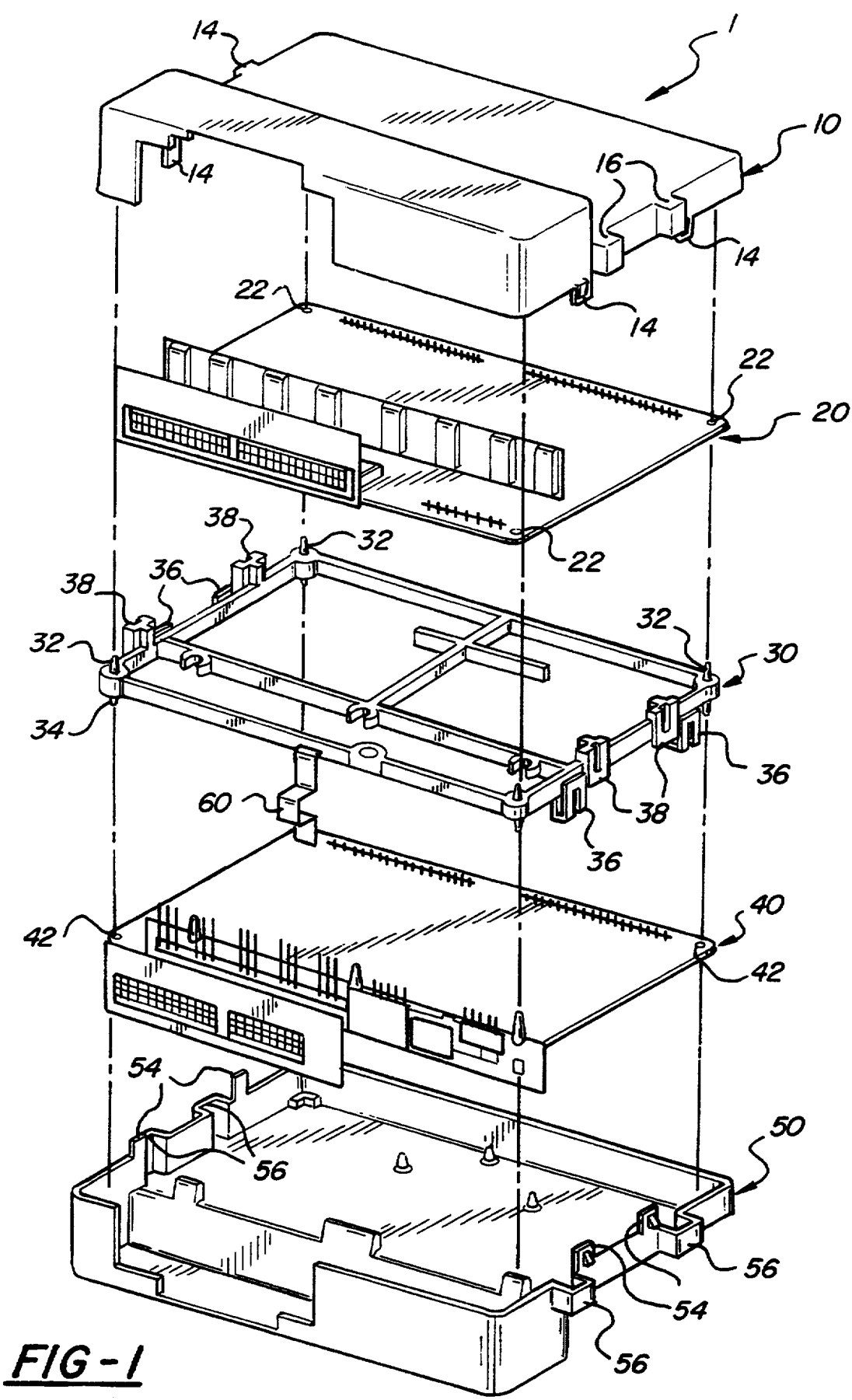
FIG. 1 is an exploded view of the control module assembly of the present invention according a first embodiment.

With reference to FIG. 1, an electronic control module 1 is shown by way of example in an exploded, perspective view. The control module 1 of FIG. 1 comprises a top case half 10 a first circuit board 20, a spacer member 30, a second circuit board 40, and a bottom case half 50. By means of the illustrated assembly, the module 1 is quickly and easily assembled by interlocking each of the above-mentioned parts in a snapping manner to be further described below.

In the preferred embodiment, the first board 20 is received on the spacer 30 by means of top pins 32 which pass into corresponding pin holes 22 provided at each corner of the first circuit board 20. Similarly, the second circuit board 40 is received on the spacer 30 by means of bottom pins 34 which are received in corresponding pin holes 42 provided at each corner of the second circuit board. By virtue of the pins 32 and 34, the circuit boards 20, 40 are positioned with respect to the spacer member 30 in a parallel arrangement.

A ground clip 60 holds the first and/or second circuit board 20, 40 with the spacer to ground the circuit arrangement (FIG. 1).

Figure 2:
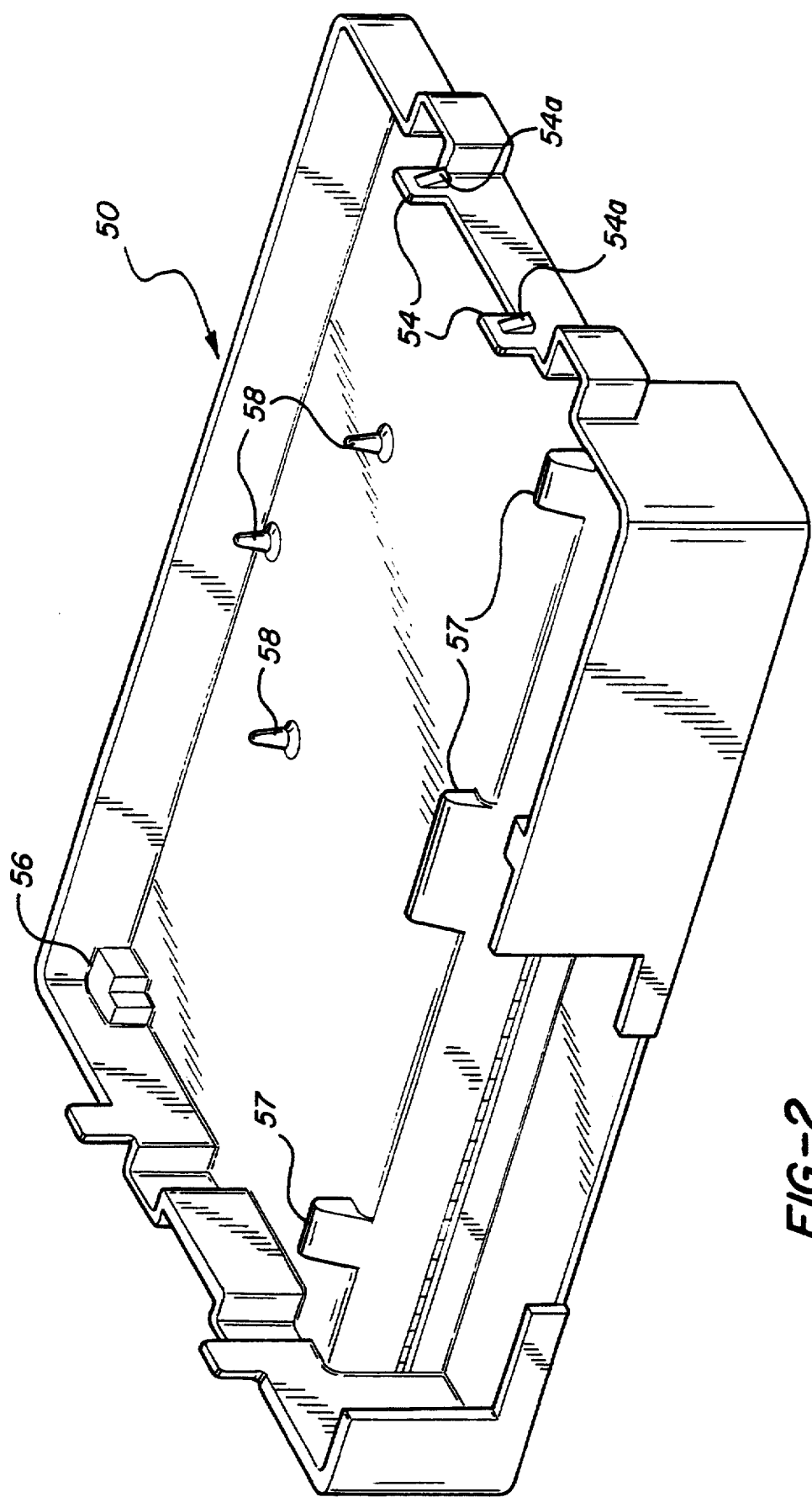
FIG. 2 is a perspective view of the bottom case half of the first embodiment of the invention.
Figure 3:
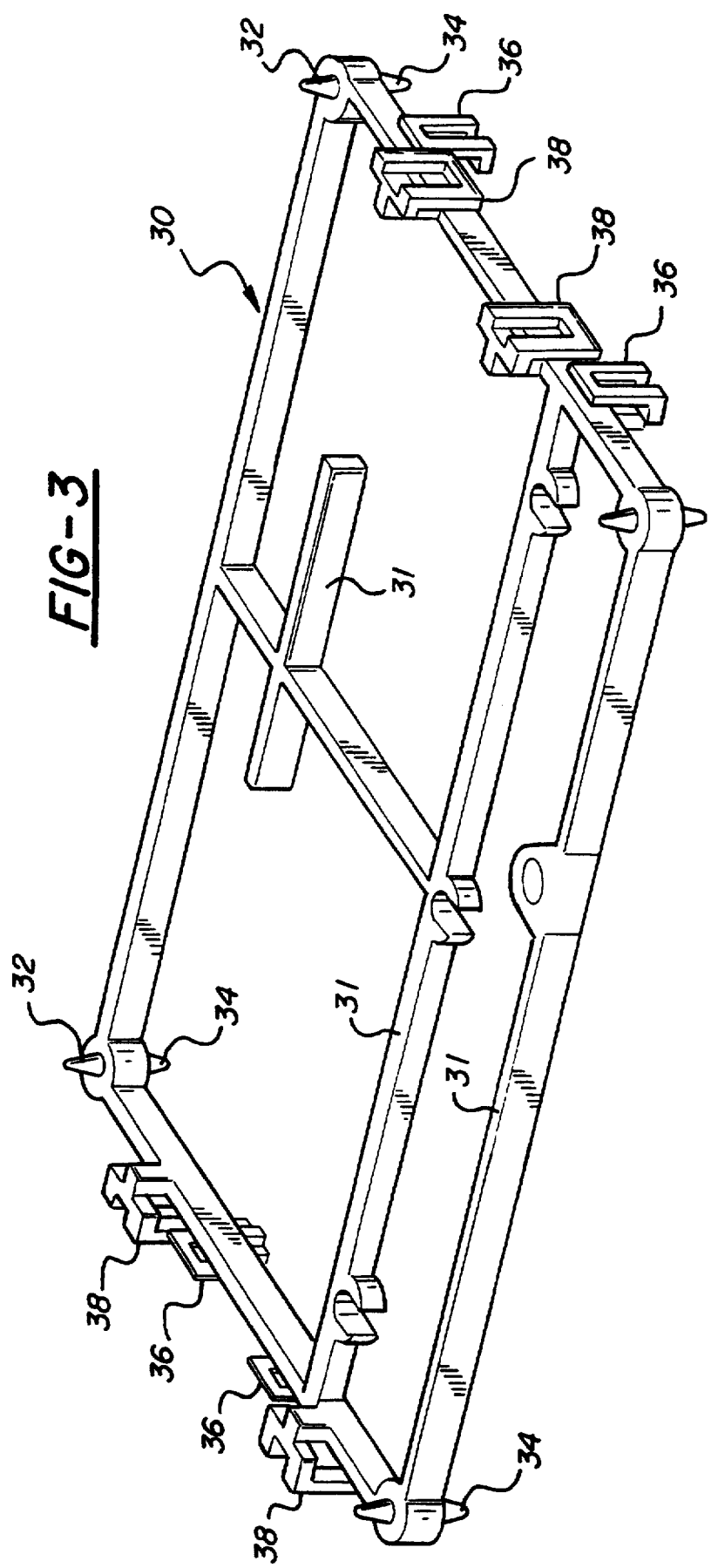
FIG. 3 is a perspective view of the spacer member of the first embodiment of the invention.
Figure 4:
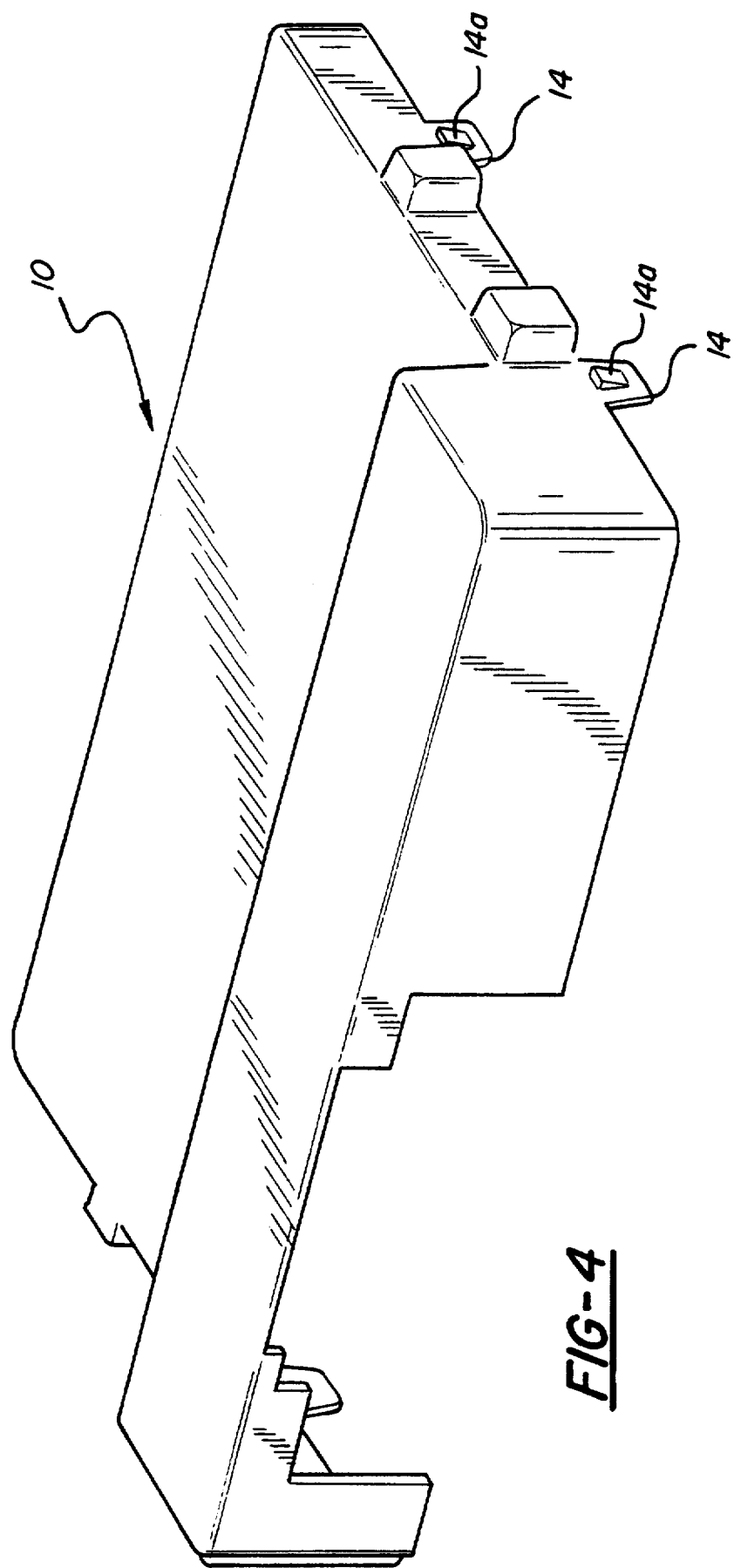
FIG. 4 is a perspective view of the top case half of the first embodiment of the invention.

The top and bottom case halves are then affixed to the circuit boards and spacer member 30 in a secured snapping manner. Specifically, the top case half 10 is provided with tangs 14 having projections 14a which engage features 36 provided on the spacer member 30 (FIG. 4). Similarly, the bottom case half 50 is provided with tangs 54 having projections 54a which engage corresponding features 38 integrally formed on the spacer member 30 (FIG. 2). In the preferred embodiment the tangs 14, 54 and the features 36, 38 are integrally formed with the case halves and the spacer member 30 respectively, thus reducing the number of fastening components. However, the features 36, 38 may be separate members which are snappingly secured to the spacer member 30 to provide a versatile housing arrangement for different electrical components, as will be described below with reference to FIG. 9.

FIG. 5 is a partial view of the top case half 10 affixed to the spacer member 30. By way of example, FIG. 5 shows one of the tangs 14 received within and snappingly engaging one of the features 36 provided on the spacer member 30. Snap engagement is accomplished by way of the tang 14 which mates with feature 36, and specifically, the projection 14a provided on the tang 14 comprises an engagement surface 14b which rests upon surface 36b of the feature 36 (FIG. 7). It should be noted that for clarity's sake the circuit boards 20 and 40 have been omitted from FIG. 5.

Similarly, FIG. 6 is a partial view of the bottom case half 50 affixed to the spacer member 30. By way of example, FIG. 6 shows one of the tangs 54 received within and snappingly engaging one of the features 38 provided on the spacer member 30. Snap engagement is accomplished by way of the tang 54 which mates with feature 38, and specifically, the projection 54a provided on tang 54 comprises an engagement surface 54b which rests upon surface 38b of the feature 38 (FIG. 8). It should be noted that for clarity's sake the circuit boards 20 and 40 have been omitted from FIG. 6.

As the top and bottom case halves 10 and 50 are affixed to the spacer member 30, the features 36 and 38 are respectively received within clip accommodating sections 56 and 16. As shown in FIG. 5, the feature 38, partially shown in dotted lines, is received within the clip accommodating section 16 in order to enclose and protect the clip assembly from damage. Similarly, the feature 36 is received within the clip accommodating section 56 in order to enclose and protect the clip assembly.

As described above, the circuit boards 20 and 40 are secured to the spacer member 30 via top and bottom pins 32, 34. The top and bottom case halves 10, 50 are further provided with support protrusions 56, 57 and 58 shown in FIG. 2, which further support the circuit board within the assembled control module. The specific arrangement of the support protrusions will vary according to the circuit board arrangement. Additionally, the protrusions 56 are shown as support benches integrally formed at each corner of the case half 50. It should be understood that the top case half 10 is formed with corresponding protrusions which mirror the protrusions 56–58 formed in the bottom case half.

The spacer member 30 is formed as a unitary body having elongated spacer walls 31 which are appropriately positioned to support the respective circuit boards 20, 40. The specific design of the spacer walls is determined by the circuit design and the positioning of the electric components carried by the circuit boards 20, 40.

Figure 9:
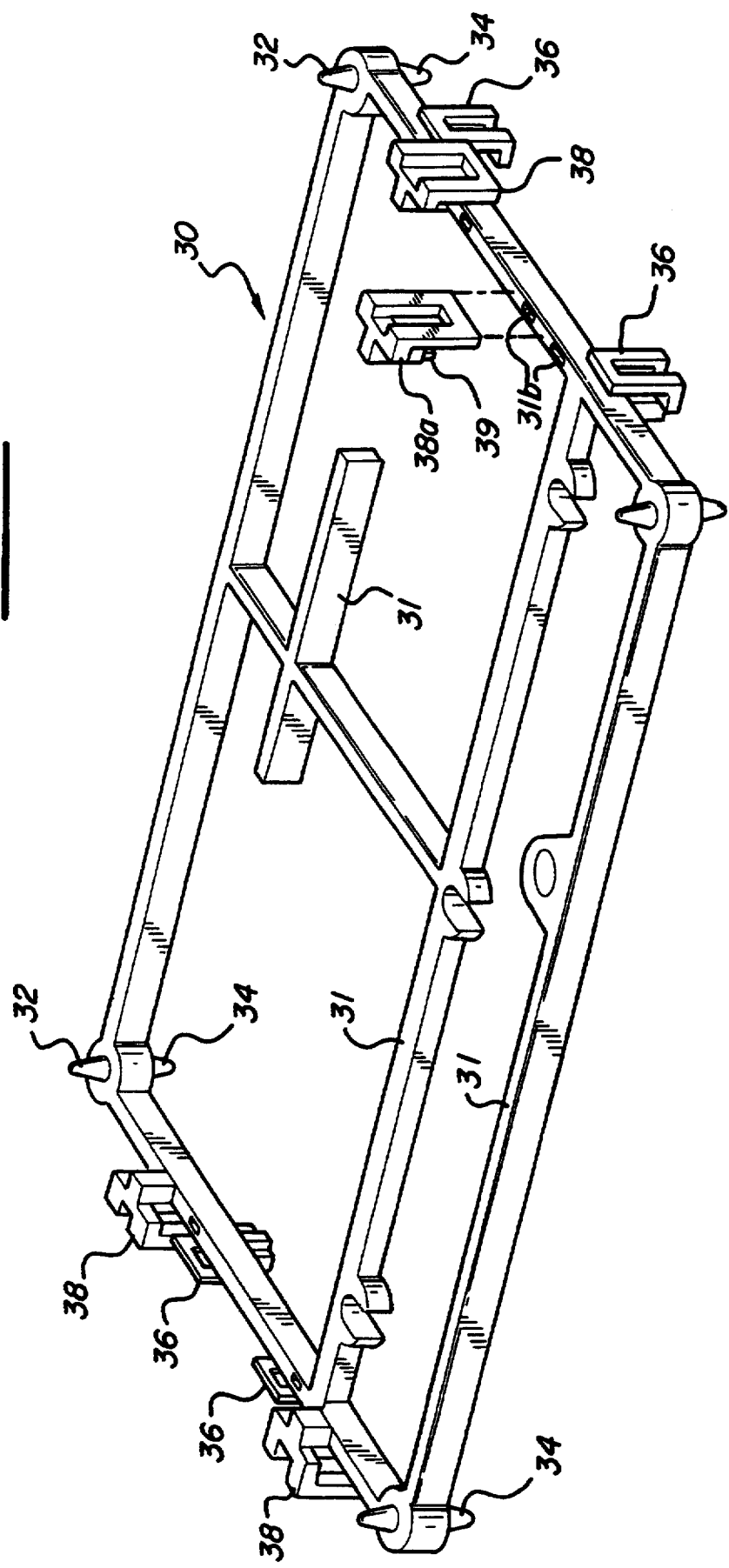
FIG. 9 shows an alternate embodiment of the spacer member of the instant invention.

FIG. 9 shows an alternate embodiment of the spacer member 30 wherein the features 36, 38 are formed as separate members which are selectively positioned on the appropriate spacer wall 31. Specifically, the feature 38a is selectively positioned by means of the projection 39 which is received in one of the recesses 31b. Therefore, the arrangement of the features may be varied in accordance with the structure of the corresponding circuit board and case halves for a particular control module.

While the invention has been particularly shown and described with reference to a preferred embodiment, it will be understood by those having ordinary skill in the art that various changes in form and detail may be made therein without departing from the spirit and scope of the invention. For example, the foregoing embodiments may be limited to a single circuit board or may be expanded to encompass more than two circuit boards.

Thus, the structural arrangement of the invention may incorporate the stacking of multiple circuit boards which are snappingly secured together within the case halves.

I claim:

1. An electronic control module including at least one circuit board and first and second housing sections joined to encase the circuit board, the improvement wherein:

the control module includes a spacer element having a planar region within the housing sections, the circuit board being parallel to such planar region and fastened thereto;

the first housing section is secured to the spacer element by a first mechanical interlock between a first set of tangs integral with said first housing section and a first set of spacer surface features extending perpendicular to said planar region from a peripheral region of said spacer element; and the second housing section is secured to the spacer element by a second mechanical interlock between a second set of tangs integral with said second housing section and a second set of spacer surface features extending perpendicular to said planar region from said peripheral region of said spacer element.

2. The electronic control module of claim 1, wherein the circuit board is fastened to the spacer element by virtue of mechanical interference between a set of pins formed on said spacer element and a set of openings formed in said circuit board.

3. The electronic control module of claim 1, wherein said first set of spacer surface features are received within an accommodating section formed on said second housing section, and said second set of spacer surface features are received within an accommodating section formed on said first housing section.

4. The electronic control module of claim 1, wherein the first set of surface features extend in a first direction away from said first housing section, and the second set of surface features extend in a second direction away from said second housing section.

5. The electronic control module of claim 4, wherein the first set of surface features define a first set of openings which receive said first set of tangs to form said first mechanical interlock, and said second set of surface features define a second set of openings which receive said second set of tangs to form said second mechanical interlock.

* * * * *